(12) United States Patent
Sawai et al.

(10) Patent No.: US 6,433,610 B1
(45) Date of Patent: Aug. 13, 2002

(54) CURRENT CLAMP CIRCUIT

(75) Inventors: Moriyasu Sawai; Kaoru Nakamura, both of Tokyo (JP)

(73) Assignee: Ando Electric Co., Ltd., Tokyo (JP)

( * ) Notice: Subject to any disclaimer, the term of this patent is extended or adjusted under 35 U.S.C. 154(b) by 0 days.

(21) Appl. No.: 09/697,727

(22) Filed: Oct. 27, 2000

(30) Foreign Application Priority Data

Oct. 29, 1999 (JP) .......................................... 11-310030

(51) Int. Cl.[7] .................................................. H03S 5/08
(52) U.S. Cl. ........................ 327/322; 327/309; 327/321
(58) Field of Search ................................ 327/320, 321, 327/322, 309; 323/312, 351; 326/82; 361/154; 328/171

(56) References Cited

U.S. PATENT DOCUMENTS

| | | | | |
|---|---|---|---|---|
| 3,582,718 A | * | 6/1971 | Spellman | 361/154 |
| 4,441,068 A | * | 4/1984 | Smith | 323/35 |
| 5,150,069 A | * | 9/1992 | Sherman | 328/171 |
| 5,212,829 A | * | 5/1993 | Brinkhaus | 455/296 |

* cited by examiner

*Primary Examiner*—Tuan T. Lam
*Assistant Examiner*—Hiep Nguyen
(74) *Attorney, Agent, or Firm*—Oliff & Berridge, PLC

(57) ABSTRACT

A current clamp circuit which can easily restrict an output current externally in an output current amplifier circuit using a current buffer IC, is provided. The current clamp circuit 10 restricts the output current in the output current amplifier circuit 20 for amplifying the output current by using the operational amplifier 2 and the current buffer IC 1, wherein the resistor 4 is connected to the output terminal of the current buffer IC, and the output current restriction unit for restricting the output current is connected to the current buffer IC 1 and the resistor 4 in parallel.

2 Claims, 2 Drawing Sheets

CURRENT CLAMP CIRCUIT

BACKGROUND OF THE INVENTION

1. Field of the Invention

The present invention relates to a current clamp circuit to clamp a current, that is, to restrict an output current externally in an output current amplifier circuit using a current buffer IC.

2. Description of Related Art

According to an earlier development, an output current amplifier circuit using a current buffer IC (Integrated Circuit) has been put to practical use. FIG. 2 shows one example of the output current amplifier circuit using the current buffer IC. In FIG. 2, the output current amplifier circuit 20 comprises a current buffer IC 1, an operational amplifier 2, and a direct current (DC) power supply 3. A positive pole side of DC power supply 3 is connected to an input terminal on a positive side of the operational amplifier 2. A negative pole side of DC power supply 3 is grounded. An output terminal of the operational amplifier 2 is connected to an input terminal of the current buffer IC 1. An output terminal A on an output side of the current buffer IC 1 is connected to a load 7 and an input terminal on a negative side of the operational amplifier 2. The load 7 is composed of a load resistor 7A and a load power supply 7B.

Herein, the current buffer IC is an amplifier capable of amplifying an output current sufficiently. In FIG. 2, an output voltage of DC power supply 3 is supplied to the input terminal on the positive side of the operational amplifier 2. Thereafter, an output of the operational amplifier 2 is supplied to the current buffer IC 1. Thereafter, an output of the current buffer IC 1 is supplied to the input terminal on the negative side of the operational amplifier 2. Further, an output current from the current buffer IC 1 is supplied to the load 7 on the basis of a voltage between the output terminal A of the current buffer IC 1 and the ground.

However, in the output current amplifier circuit 20 according to an earlier development, using the current buffer IC 1, there has been a problem that the maximum output current of the current buffer IC 1 flows into the load 7 as a load current.

Further, in the output current amplifier circuit 20, when the output terminal of the operational amplifier 2 is connected to the load 7 directly without using the current buffer IC 1, there has been a problem that it is not possible to flow the sufficient load current into the load 7 because the output current from the operational amplifier 2 is limited generally. Consequently, it is necessary to connect the current buffer IC 1 to the output terminal of the operational amplifier 2 in order to flow the sufficient load current into the load 7.

SUMMARY OF THE INVENTION

The present invention was developed in view of the above-described problems.

An object of the present invention is to provide a current clamp circuit which can easily clamp a current, that is, can easily restrict an output current externally in an output current amplifier circuit using a current buffer IC.

In order to solve the above-described object, in accordance with one aspect of the present invention, a current clamp circuit for restricting an output current in an output current amplifier circuit for amplifying the output current by using an operational amplifier (for example, an operational amplifier 2 shown in FIG. 1) and a current buffer IC (for example, a current buffer IC 1 shown in FIG. 1), comprises:

a resistor (for example, a resistor 4 shown in FIG. 1) which is connected to an output terminal of the current buffer IC; and an output current restriction unit (for example, two diodes 5 and 6 shown in FIG. 1) connected to the current buffer IC and the resistor in parallel, for restricting the output current.

The output current means a current which is produced by joining one flowing through the resistor from the output terminal of the current buffer IC to one flowing from the output current restriction unit. The current value of the current flowing through the resistor from the current buffer IC is determined by the voltage value of the voltage applied to the output current restriction unit, the resistance of the resistor, and the resistance of the current buffer IC. The current value of the current flowing from the output current restriction unit is determined by the current value of the rated load current of the operational amplifier.

According to the current clamp circuit having such a structure, in the current clamp circuit for restricting the output current in the output current amplifier circuit for amplifying the output current by using the operational amplifier and the current buffer IC, the resistor is connected to the output terminal of the current buffer IC, and the output current restriction unit for restricting the output current is connected to the current buffer IC and the resistor in parallel.

Preferably, in a current clamp circuit as described above, the output current restriction unit comprises two diodes connected to each other in parallel and in an opposite direction.

Preferably, in a current clamp circuit as described above, the output current restriction unit restricts an output current flowing from the current buffer IC through the resistor by a forward voltage value of either of the diodes.

According to the current clamp circuit as described previously, it is possible to easily restrict the output current externally in the output current amplifier circuit using the current buffer IC.

BRIEF DESCRIPTION OF THE DRAWINGS

The present invention will be become more fully understood from the detailed description given hereinafter and the accompanying drawings which are given by way of illustration only, and thus are not intended as a definition of the limits of the present invention, and wherein.

PREFERRED EMBODIMENT OF THE INVENTION

Hereinafter, an embodiment of a current clamp circuit according to the present invention will be explained with reference to FIG. 1, in detail.

Firstly, the structure of the current clamp circuit 10 will be explained, as follows.

Figure 1:
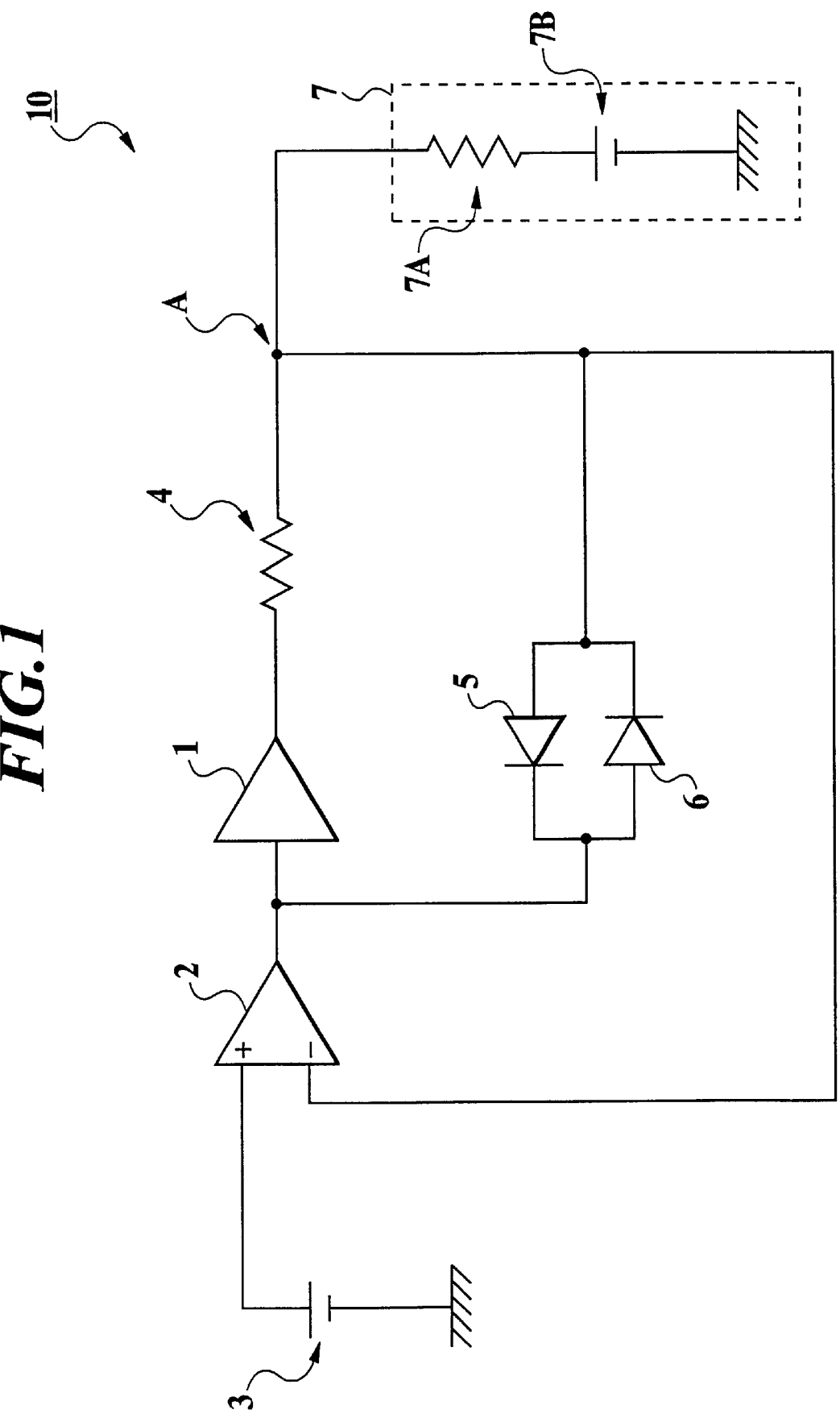
FIG. 1 is a view showing a circuit structure of a current clamp circuit 10 according to an embodiment to which the present invention is applied.

FIG. 1 is a view showing a circuit structure of the current clamp circuit 10 according to an embodiment of the present invention.

Figure 2:
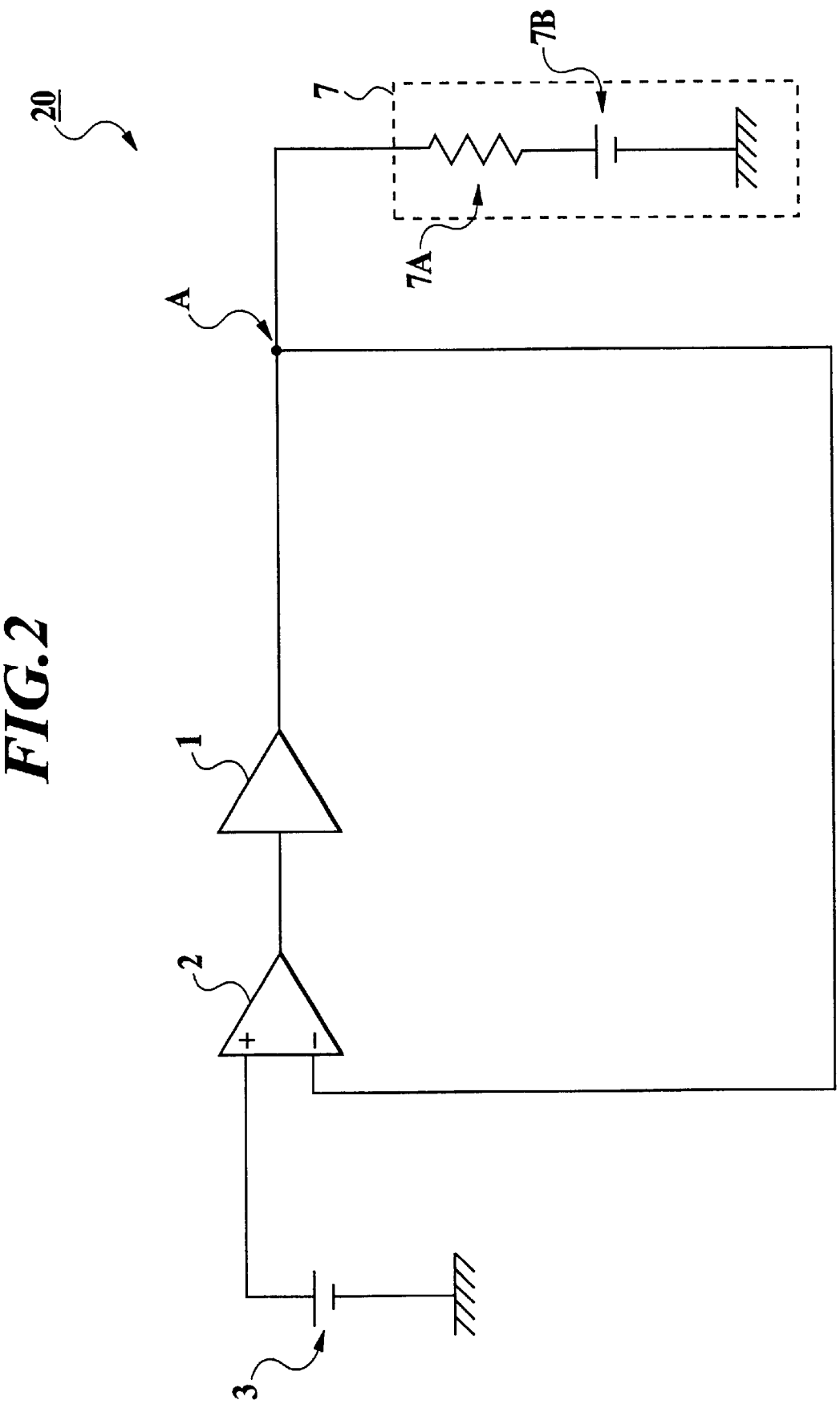
FIG. 2 is a view showing a circuit structure of an output current amplifier circuit 20 as an example according to an earlier development.

In FIG. 1, the same reference numerals are attached to the same elements as the output current amplifier circuit 20 shown in FIG. 2. The explanations thereof are omitted.

In FIG. 1, the current clamp circuit 10 comprises a current buffer IC 1, an operational amplifier 2, a resistor 4, and two diodes 5 and 6. A DC power supply 3 is connected to an input terminal of the current clamp circuit 10, and a load 7 is connected to an output terminal of the current clamp circuit 10. The load 7 comprises a load resistor 7A and a load power supply 7B. In the current clamp circuit 10, the additional elements, as compared with the output current amplifier circuit 20 of the earlier development, are the resistor 4 and diodes two 5 and 6.

In the current clamp 10, the resistor 4 is connected between the output terminal of the current buffer IC 1 and the output terminal A. The diodes 5 and 6 are connected to each other in parallel so that the diode 5 flows a current in one direction and the diode 6 flows a current in the opposite direction to the one direction. Further, the diodes 5 and 6 are connected between the other end of the resistor 4, which is not connected to the current buffer IC 1, that is, the output terminal A and the input terminal of the current buffer IC 1.

Secondly, the function of the current clamp circuit 10 will be explained, as follows.

In the current clamp circuit 10, when the current flows from the output terminal of the current buffer IC 1 through the resistor 4, the voltage difference is caused to the extent of the voltage drops across the resistor 4 and the current buffer IC 1 between the input terminal of the current buffer IC 1 and the output terminal A. Because the diodes 5 and 6 are connected between the input terminal of the current buffer IC 1 and the output terminal A, the voltage difference does not exceed the forward voltage value VF of the diodes 5 and 6. Consequently, when the resistance value of the current buffer IC 1 and the resistor 4 is R, a current having not less than VF/R does not flow between the input terminal of the current buffer IC 1 and the output terminal A.

Accordingly, in order to flow the more than VF/R output current having not less than VF/R into the load 7, it is necessary that the current flowing from the current buffer IC 1 through the resistor 4 and the current flowing from the diode 6 are joined to each other to make the load current. In this case, the current value of the current flowing from the current buffer IC 1 through the resistor 4 is VF/R, and the current value of the current flowing into the diode 6 is a value of the rated load current of the operational amplifier 2. When the operational amplifier 2 is flowing the output current more than the rated load current thereof, the operational amplifier 2 changes the internal voltage thereof in such a direction not to flow the output current more than the rated load current thereof. Consequently, the operational amplifier 2 restricts the output current thereof less than the rated load current thereof.

That is, when the load current (output current) flowing into the load 7 is represented by the reference mark I, the rated load current of the operational amplifier 2 is represented by the reference mark I1, the resistance value of the resistor 4 is represented by the reference mark R1, and the internal resistance of the current buffer IC 1 is represented by the reference mark R2, the equations expressing the relations thereof will be described as follows.

$$I=(VF/R)+I1 \quad (1)$$

$$R=R1+R2 \quad (2)$$

Each practical value will be substituted for each reference mark of the above-described equations, respectively.

In FIG. 1, the resistance value R1 of the resistor 4 is 10Ω, the forward voltage values VF of the diodes 5 and 6 are 0.7V respectively, the rated load current I1 of the operational amplifier 2 is 10 mA, the output voltage value of DC power supply 3 is 5V, the resistance value of the load resistor 7A is 20Ω, and the load power supply 7B is 0V. Because the resistance value R2 of the internal resistance of the current buffer IC 1 is too small, the resistance value R2 is not considered on the above-described equation.

When the load 7 is not connected to the output terminal A of the current clamp circuit 10, the current does not flow at the output terminal A in the current clamp circuit 10. Accordingly, the potential at the output terminal A is 5V and is the same as the potential at the input terminal in the positive side of the operational amplifier 2. When the load 7 is connected to the output terminal A of the current clamp circuit 10 at this state, the current having the following value obtained by the above-described equation (1) flows from the current buffer IC 1 through the resistor 4.

$$0.7/10=70 \, [mA]$$

Further, the current having 10 [mA] that is the rated load current I1 of the operational amplifier 2 flows into the diode 6. Consequently, the output current value at the output terminal A is obtained by the above-described equation (1) as follows.

$$I=70+10=80 \, [mA]$$

In this state, the current clamp circuit 10 is stabilized. Accordingly, the potential at the output terminal A is determined by the total value of the current flowing through the resistor 4 and the current flowing into the diode 6 and by the resistance value of the load resistor 7A, as follows.

$$80 \, [mA] \times 20[\Omega]=1.6 \, [V]$$

Accordingly, because the potential at the output terminal A is 1.6V, and the voltage of the load voltage 7B is 0V, and the resistance value of the load resistor 7A is 20Ω, the output current at the output terminal A does not flow more than 80 [mA]. That is, the output current is restricted to 80 [mA].

As described above, in the current clamp circuit 10 according to the embodiment of the present invention, the resistor 4 and the diodes 5 and 6 are added to the output current amplifier circuit 20 according to the earlier development, using the current buffer IC 1.

Therefore, the current (VF/R) flowing from the current buffer IC 1 through the resistor 4 is determined by the resistance value R of the current buffer IC 1 and the resistor 4 and the forward voltage value VF of the diode 6. Further, the current flowing into the diode 6 is determined by the current value I1 of the rated load current of the operational amplifier 2. Accordingly, it is possible to provide a structure wherein the current I flowing at the output terminal A does not flow into the load more than a predetermined current value.

Consequently, by the current clamp circuit 10 according to the embodiment of the present invention, it is possible to easily restrict the output current externally in the output current amplifier circuit 20 using the current buffer IC 1.

Although it has been explained that the load 7 comprises the load resistor 7 and the load power supply 7B in the embodiment of the present invention, the load 7 may comprise another element, for example, IC or the like.

According to the present invention, a main effect can be obtained, as follows.

It is possible to easily restrict the output current externally in the output current amplifier circuit using the current buffer IC.

The entire disclosure of Japanese Patent Application No. Tokugan-hei 11-310030 filed on Oct. 29, 1999 including specification, claims, drawings and summary are incorporated herein by reference in its entirety.

What is claimed is:

1. A current clamp circuit comprising an operational amplifier and a current buffer IC, for amplifying an input current and for restricting an output current, the current clamp circuit further comprising:

a resistor having first terminal connected to an output terminal of the current buffer IC; and an output current restriction unit comprising two diodes connected to a second terminal of the resistor and to an input terminal of the current buffer IC. for restricting the output current, wherein the diodes are connected to each other in parallel and in an opposite direction.

2. The current clamp circuit according to claim 1, wherein the output current restriction unit restricts an output current flowing from the current buffer IC through the resistor by a forward voltage value of either of the diodes.

* * * * *